(12) United States Patent
He et al.

(10) Patent No.: US 10,910,452 B2
(45) Date of Patent: Feb. 2, 2021

(54) METHOD FOR ALLEVIATING COLOR SHIFT AT LARGE VIEWING ANGLE, AND DISPLAY PANEL

(71) Applicant: Shenzhen China Star Optoelectronics Technology Co., Ltd., Guangdong (CN)

(72) Inventors: Jian He, Guangdong (CN); Shen Sian Syu, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 114 days.

(21) Appl. No.: 15/562,680

(22) PCT Filed: Jul. 13, 2017

(86) PCT No.: PCT/CN2017/092689
§ 371 (c)(1),
(2) Date: Sep. 28, 2017

(87) PCT Pub. No.: WO2018/218744
PCT Pub. Date: Dec. 6, 2018

(65) Prior Publication Data
US 2019/0386077 A1    Dec. 19, 2019

(30) Foreign Application Priority Data
Jun. 1, 2017 (CN) .......................... 2017 1 0404552

(51) Int. Cl.
*H01L 27/32* (2006.01)
(52) U.S. Cl.
CPC ...... *H01L 27/3246* (2013.01); *H01L 27/3211* (2013.01); *H01L 27/3272* (2013.01)

(58) Field of Classification Search
CPC ............. H01L 27/3246; H01L 27/3211; H01L 27/3244; H01L 51/5284; H01L 27/3272; H01L 27/3218; H01L 27/322
See application file for complete search history.

(56) References Cited

U.S. PATENT DOCUMENTS 7,541,734 B2 * 6/2009 Yamazaki ............... H01L 33/08
                                                        313/503
8,866,170 B2   10/2014 Moon et al.
(Continued)

FOREIGN PATENT DOCUMENTS

| CN | 104851903 A | * | 8/2015 | ......... H01L 27/3244 |
| CN | 104851903 A |   | 8/2015 | |

(Continued)

OTHER PUBLICATIONS

International Search Report and Written Opinion for International Application No. PCT/CN2017/092689, dated Jul. 13, 2017.
(Continued)

*Primary Examiner* — Khiem D Nguyen

(57) ABSTRACT

Disclosed is a method for alleviating color shift of a display panel at a large viewing angle. The panel includes a sub-pixel array formed by R, G, B sub-pixels, and black matrix areas located between the sub-pixels. The method includes providing, above the sub-pixel array, an optical grating that is parallel with the sub-pixel array. The optical grating includes transparent areas and non-transparent areas. The non-transparent areas are provided above the black matrix areas. The optical grating is configured as such that when a sub-pixel is observed at a large viewing angle, light transmitted through the sub-pixel is partially blocked by the non-transparent areas of the optical grating.

12 Claims, 4 Drawing Sheets

(56) References Cited

U.S. PATENT DOCUMENTS

| | | | | |
|---|---|---|---|---|
| 9,423,540 | B2* | 8/2016 | Lu | G02B 27/44 |
| 9,466,654 | B2* | 10/2016 | Baek | H01L 27/3272 |
| 10,234,677 | B1* | 3/2019 | Guntaka | G02B 5/003 |
| 2001/0026347 | A1* | 10/2001 | Sawasaki | G02F 1/13394 |
| | | | | 349/156 |
| 2005/0073247 | A1* | 4/2005 | Yamazaki | H01L 27/322 |
| | | | | 313/503 |
| 2007/0153160 | A1* | 7/2007 | Lee | G02F 1/133512 |
| | | | | 349/95 |
| 2013/0241964 | A1* | 9/2013 | Ohyama | G09G 3/003 |
| | | | | 345/690 |
| 2014/0332778 | A1* | 11/2014 | Ito | H01L 27/3258 |
| | | | | 257/40 |
| 2016/0260371 | A1* | 9/2016 | Wang | G09G 3/2003 |
| 2017/0033164 | A1* | 2/2017 | Liu | G02B 5/223 |
| 2017/0146854 | A1* | 5/2017 | Cui | G02F 1/133514 |

FOREIGN PATENT DOCUMENTS

| | | | | |
|---|---|---|---|---|
| CN | 104880848 A | * | 9/2015 | G02F 1/133514 |
| CN | 104880848 A | | 9/2015 | |
| CN | 105204217 A | | 12/2015 | |
| CN | 105470285 A | | 4/2016 | |
| CN | 106019694 A | | 10/2016 | |

OTHER PUBLICATIONS

Chinese Office Action and Search Report for Chinese Patent Application No. 201710404552.2, dated Aug. 3, 2018.

* cited by examiner

METHOD FOR ALLEVIATING COLOR SHIFT AT LARGE VIEWING ANGLE, AND DISPLAY PANEL

CROSS-REFERENCE TO RELATED APPLICATIONS

This application claims the priority of Chinese patent application CN 201710404552.2, entitled "Method for alleviating color shift at large viewing angle, and display panel" and filed on Jun. 1, 2017, the entirety of which is incorporated herein by reference.

FIELD OF THE INVENTION

The present disclosure relates to the technical field of display, and in particular, to a method for alleviating color shift at large viewing angle and a display panel.

BACKGROUND OF THE INVENTION

In recent years, large-size display panels are gradually occupying an increasing share of ordinary end markets. However, when a display panel is increased in size, a viewing angle of a user is also increased, which leads to color shift of the display panel at large viewing angle.

FIG. 1 schematically shows intensity variation of light of different wavelengths emitted by a display panel as a viewing angle varies. The dotted arrows in FIG. 1 indicate attenuation of a peak value of wavelength intensity when a viewing angle is increased from 0° to 60°. In terms of intensity variation, attenuation of a blue wavelength (450-470 nm) is the most obvious, and attenuation of a green wavelength (515-530 nm) and a red wavelength (620-625 nm) is not that obvious, which leads to color shift of a white point, and further affects display effect of the panel. FIG. 2 schematically shows color shift of a white point (CIE 1931 xy). As shown in FIG. 2, when the viewing angle is increased, the white point E deviates towards a direction indicated by the arrow.

SUMMARY OF THE INVENTION

The present disclosure provides a general inventive concept for alleviating color shift of a display panel at large viewing angle, which is intended to solve the above technical problem of color shift at large viewing angle. By adding structures that block light of sub-pixels, difference in light intensity attenuation of the sub-pixels with variation of the viewing angle is compensated, whereby color shift of a display panel at a large viewing angle is alleviated.

The present disclosure, at a first aspect, provides a method for alleviating color shift of a display panel at a large viewing angle. The display panel comprises a sub-pixel array formed by R, G, B sub-pixels, and black matrix areas located between the sub-pixels. The method comprises providing, on the sub-pixel array, an optical grating that is parallel with the sub-pixel array. The optical grating includes transparent areas and non-transparent areas. The non-transparent areas are provided on the black matrix areas. The optical grating is configured as such that when a sub-pixel is observed at a large viewing angle, light transmitted by the sub-pixel is partially blocked by the non-transparent areas of the optical grating.

In one embodiment, the non-transparent areas of the optical grating are provided only on black matrix areas that are located on two sides of each of the G sub-pixels.

In another embodiment, the non-transparent areas of the optical grating are provided on black matrix areas located on two sides of each of the G sub-pixels and each of the R sub-pixels.

The present disclosure, at a second aspect, provides a method for alleviating color shift of a top-lit OLED display panel at a large viewing angle. The display panel comprises a sub-pixel array formed by R, G, B sub-pixels, each of the sub-pixels including a pixel defining layer. The method comprises increasing a thickness of a pixel defining layer of a sub-pixel, so that when the sub-pixel is observed at a large viewing angle, light transmitted by the sub-pixel is partially blocked by the pixel defining layer.

In one embodiment, only a thickness of a pixel defining layer of the G sub-pixel is increased.

In another embodiment, thicknesses of pixel defining layers of the G sub-pixel and the R sub-pixel are increased.

The present disclosure, at a third aspect, provides a display panel, which to comprises a sub-pixel array formed by R, G, B sub-pixels, and black matrix areas located between the sub-pixels. The sub-pixel array of the display panel is provided thereon with an optical grating that is parallel with the sub-pixel array. The optical grating includes transparent areas and non-transparent areas. The non-transparent areas are provided on the black matrix areas. The optical grating is configured as such that when a sub-pixel is observed at a large viewing angle, light transmitted by the sub-pixel is partially blocked by the non-transparent areas of the optical grating.

In one embodiment, the non-transparent areas of the optical grating are provided only on black matrix areas that are located on two sides of each of the G sub-pixels.

In another embodiment, the non-transparent areas of the optical grating are provided on black matrix areas located on two sides of each of the G sub-pixels and each of the R sub-pixels.

In one embodiment, the display panel is a top-lit OLED display panel. A thickness of a pixel defining layer of a sub-pixel of the display panel is increased so that when the sub-pixel is observed at a large viewing angle, light transmitted by the sub-pixel is partially blocked by the pixel defining layer.

In one embodiment, only a thickness of a pixel defining layer of the G sub-pixel is increased.

In another embodiment, thicknesses of pixel defining layers of the G sub-pixel and the R sub-pixel are increased.

A beneficial effect achieved by the present disclosure is that by adding structures that block light of sub-pixels, difference in light intensity attenuation of the sub-pixels with variation of the viewing angle is compensated, whereby color shift of a display panel at a large viewing angle is alleviated.

Other advantages, objectives, and features of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art, and constitute one part of the description. The drawings are used for interpreting the present disclosure together with the embodiments, not for limiting the present disclosure. In the drawings.

In the drawings, same components use same reference characters, and the drawings are not drawn to actual scale.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Figure 1:
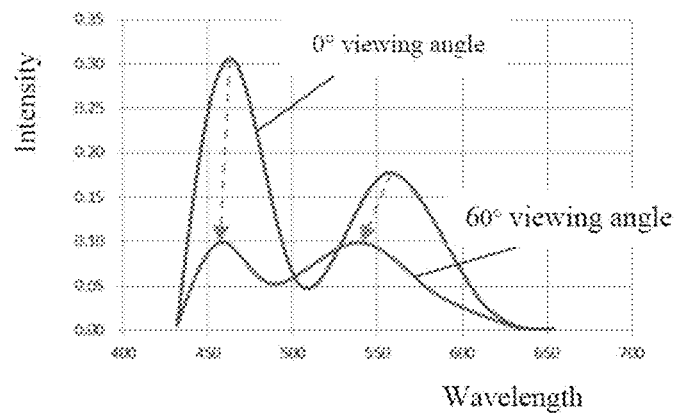
FIG. 1 schematically shows intensity variation of light of different wavelengths emitted by a display panel as a viewing angle varies.
Figure 2:
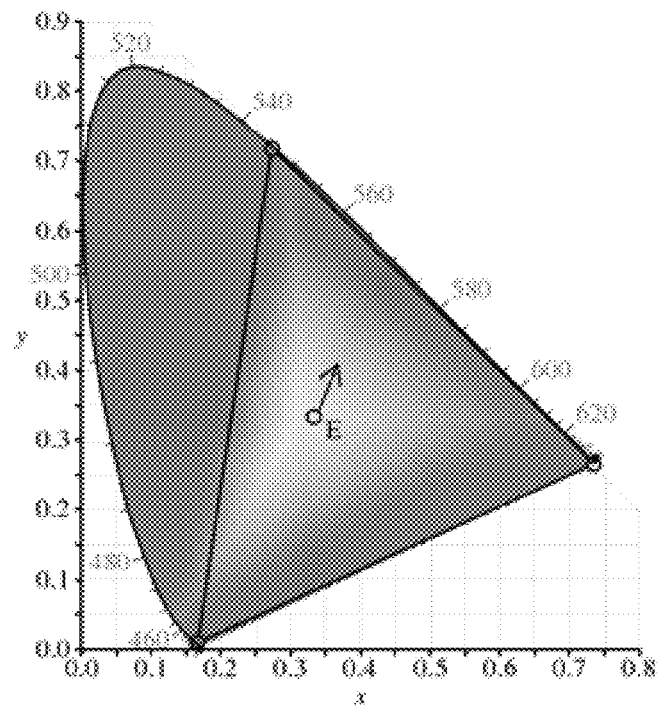
FIG. 2 schematically shows color shift of a white point.
Figure 3:
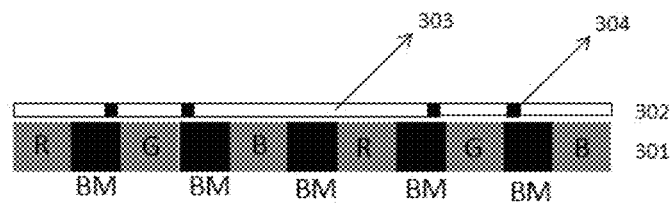
FIG. 3 schematically shows a side view of an optical grating arranged in a display panel according to one embodiment of the present disclosure.
Figure 4:
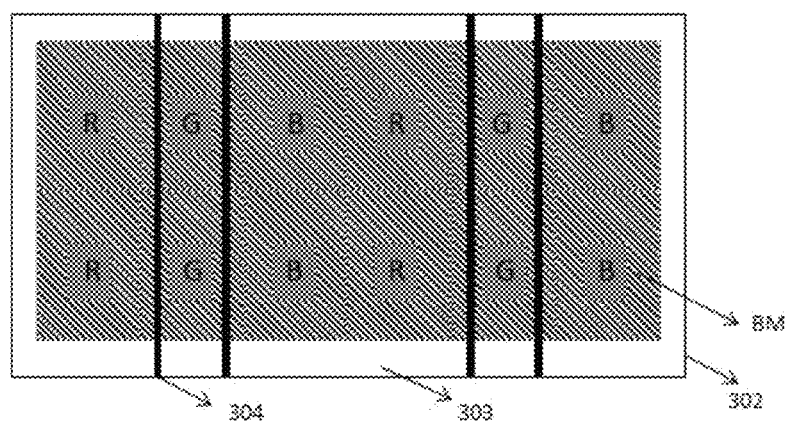
FIG. 4 schematically shows a front view of the optical grating arranged in the display panel according to one embodiment of the present disclosure.

FIG. 3 and FIG. 4 together schematically show an optical grating arranged in a display panel according to one embodiment of the present disclosure. FIG. 3 is a side view and FIG. 4 is a front view. As can be seen in FIGS. 3 and 4, in this embodiment, the display panel comprises: a sub-pixel array 301 formed by R, G, B sub-pixels, and black matrix areas (non-luminance areas) located between the sub-pixels. The sub-pixel array 301 is provided thereon with an optical grating 302 that is parallel with the sub-pixel array 301. The optical grating 302 includes transparent areas 303 and non-transparent areas 304. The non-transparent areas are provided on the black matrix areas.

In the embodiment shown in FIGS. 3 and 4, the non-transparent areas 304 of the optical grating 302 are provided only on black matrix areas that are located on two sides of each of the G sub-pixels. This, however, is exemplary but not restrictive. In another embodiment, the non-transparent areas 304 of the optical grating 302 may be provided on black matrix areas that are located on two sides of each G sub-pixel and each R sub-pixel.

Because the non-transparent areas 304 of the optical grating 302 are provided only on the black matrix areas, the optical grating 302 does not have an effect on display from a front viewing angle. In the embodiment shown in FIGS. 3 and 4, with the increase of a viewing angle, light of the G sub-pixel may be blocked by the non-transparent areas 304 of the optical grating 302 and intensity of the light may therefore be affected, light intensity attenuation is thus caused due to natural intensity attenuation of the light of the G sub-pixel with the increase of the viewing angle as well as blocking by the non-transparent areas 304 of the optical grating 302. Specific parameters of the optical grating 302, such as size and height of the non-transparent areas 304 and positions of the non-transparent areas 304 relative to the sub-pixels can be set based on intensity attenuation of light of the sub-pixels with variation of the viewing angle. Shapes of the non-transparent areas of the optical grating 302 can also be adjusted according to arrangement mode of the sub-pixel array.

Figure 5:
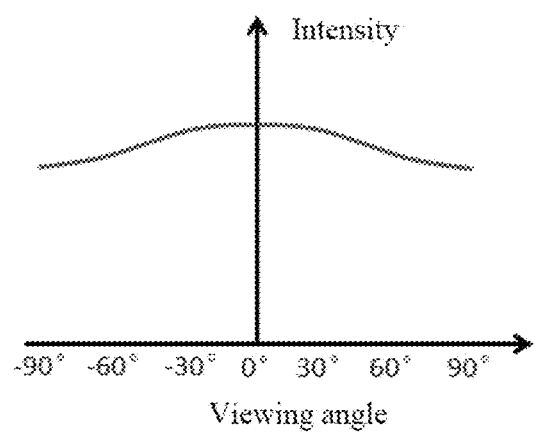
FIG. 5 schematically shows intensity attenuation of light of sub-pixels caused by an optical grating at different viewing angels.
Figure 6:
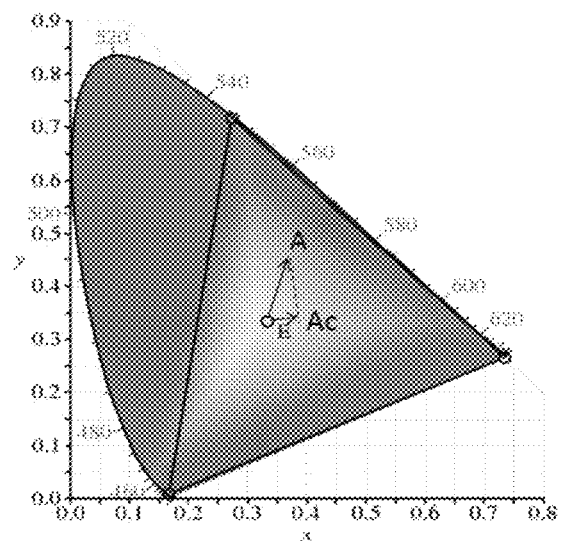
FIG. 6 schematically shows effect of alleviation of color shift by means of the optical grating.

FIG. 5 schematically shows intensity attenuation of light of the sub-pixels caused by the optical grating at different viewing angels. As shown in FIG. 5, as the viewing angle increases, light intensity of the sub-pixels gradually reduces. FIG. 6 schematically shows effect of alleviation of color shift by means of the optical grating.

Suppose light intensity attenuation rates of the R, G, B sub-pixels themselves, at a viewing angle θ, are $f_R(θ)$, $f_G(θ)$, $f_B(θ)$, respectively, and intensities of light transmitted by the R, G, B sub-pixels, at a viewing angle of 0°, are $Lv_R$, $Lv_G$, $Lv_B$, then light intensities $Lv'_R$, $Lv'_G$, $Lv'_B$ of the R, G, B sub-pixels at the viewing angle θ respectively are:

$$\begin{cases} Lv'_R = f_R(θ) * Lv_R \\ Lv'_G = f_G(θ) * Lv_G \\ Lv'_B = f_B(θ) * Lv_B \end{cases} \quad \text{Expression I}$$

Because $f_R(θ)$, $f_G(θ)$, $f_B(θ)$ are different from one another, it follows that $Lv'_R:Lv'_G:Lv'_B \neq Lv_R:Lv_G:Lv_B$ Besides, the attenuation of $f_G(θ)$ is the most obvious. As a result, a white point deviates. For example, as shown in FIG. 6, the white point deviates from point E to point A, and exhibits a yellowish color.

After the optical grating 302 is provided in the embodiment shown in FIGS. 3 and 4, suppose an attenuation rate of light intensity caused by the optical grating 302 is $f_{barrier}(θ)$, then light intensities $Lv''_R$, $Lv''_G$, $Lv''_B$ of the R, G, B sub-pixels at the viewing angle θ respectively are:

$$\begin{cases} Lv''_R = f_R(θ) * Lv_R \\ Lv''_G = f_G(θ) * f_{barrier}(θ) * Lv_G \\ Lv''_B = f_B(θ) * Lv_B \end{cases} \quad \text{Expression 2}$$

By enabling $f_G(θ)*f_{barrier}(θ)=f_B(θ)$, a color shift can be reduced. For example, the white point in FIG. 6 deviates to point Ac. As can be seen, the arrangement of the optical grating alleviates the color shift.

Figure 7:
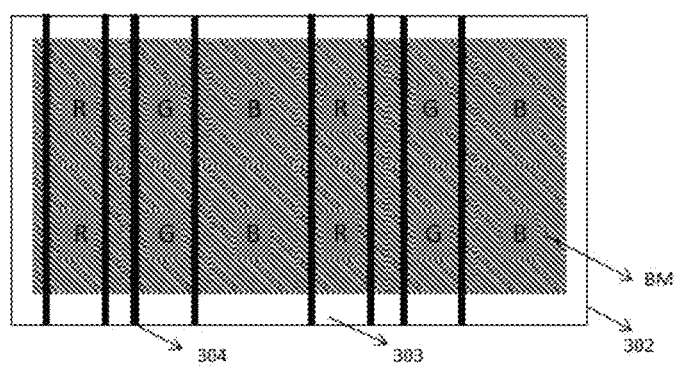
FIG. 7 schematically shows a front view of an optical grating arranged in a display panel according to another embodiment of the present disclosure.

FIG. 7 schematically shows a front view of an optical grating arranged in a display panel according to another embodiment of the present disclosure. In this embodiment, black matrix areas located on two sides of each of the G sub-pixels and each of the R sub-pixels are provided thereon with non-transparent areas 304 of an optical grating 302. Similar to the principles of the above embodiments described in conjunction with FIGS. 3 to 6, by setting the optical grating 302, color shift can be alleviated. Parameters of the non-transparent areas of the optical grating 302 can be set based on intensity attenuation of light of the sub-pixels. A specific shape of the optical grating 302 can be adjusted according to arrangement mode of the sub-pixel array.

Figure 8:
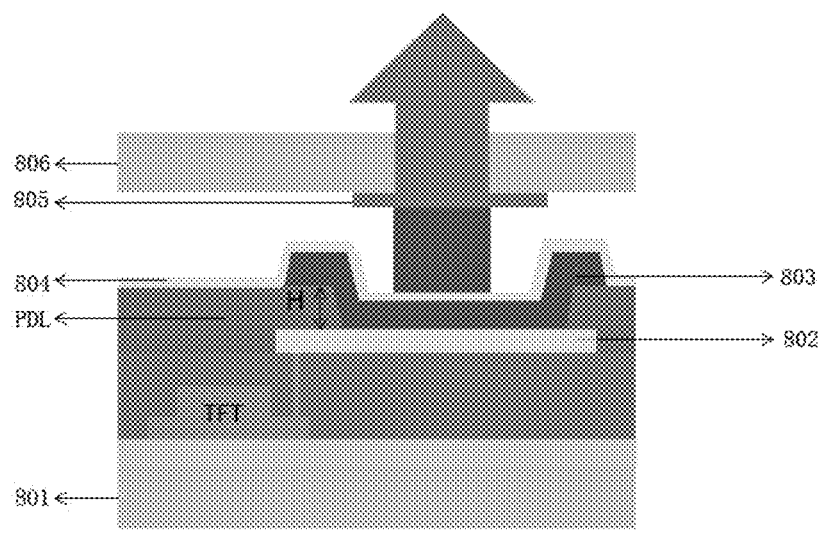
FIG. 8 schematically shows structure of a top-lit OLED.

FIG. 8 schematically shows structure of a top-lit organic light-emitting diode (OLED), which, from bottom up, comprises: a substrate 801, a thin film transistor (TFT), an anode 802, a pixel defining layer (PDL), a light-emitting layer 803, a transparent cathode 804, a color filter 805, and glass 806. In the embodiment shown in FIG. 8, light intensity attenuation of a G sub-pixel with variation of a viewing angle can be adjusted by adjusting a thickness H of a corresponding PDL of the G sub-pixel. Parameters for adjusting the thickness of the PDL can be set based on light intensity attenuation of R, G, B sub-pixels. As shown in the Figure, by increasing the thickness H of the PDL of the G sub-pixel, light transmitted by the G sub-pixel is partially blocked by the PDL at a large viewing angle, and the light intensity of the G sub-pixel is therefore attenuated. By way of this, light intensity attenuation of the R, G, B sub-pixels are substantially the same, which thus alleviates color shift caused by un-uniformity of light intensity attenuation of R, G, B sub-pixels at a large viewing angle.

In the embodiment shown in FIG. 8, adjustment is made only to the PDL of the G sub-pixel. In other embodiments, thicknesses of PDLs of both of the G sub-pixel and the R sub-pixel can be adjusted. Parameters for adjusting the thicknesses of the PDLs can be set based on light intensity attenuation of the R, G, B sub-pixels.

The above embodiments are described only for better understanding, rather than restricting the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A method for alleviating color shift of a display panel at a large viewing angle,
   wherein the display panel comprises a sub-pixel array formed by R, G, B sub-pixels, and black matrix areas located between the sub-pixels, and
   wherein the method comprises providing, above the sub-pixel array, an optical grating that is parallel with the sub-pixel array,
   wherein the optical grating includes transparent areas and non-transparent areas, the non-transparent areas being provided above the black matrix areas, a width of each non-transparent area being less than a width of a part of the black matrix area between every two adjacent sub-pixels; and
   wherein the optical grating is configured as such that when a sub-pixel is observed at a large viewing angle, light transmitted through the sub-pixel is partially blocked by the non-transparent areas of the optical grating;
   wherein a projection of each non-transparent area on the display panel is not located within the sub-pixels;
   wherein a distance between the projection of each non-transparent area on the display panel and a G sub-pixel being proximate to the projection of each non-transparent area is less than each of a distance between the projection of each non-transparent area and an R sub-pixel being proximate to the projection of each non-transparent area and a distance between the projection of each non-transparent area and a B sub-pixel being proximate to the projection of each non-transparent area.

2. The method according to claim 1, wherein the non-transparent areas of the optical grating are provided only above black matrix areas that are located on two sides of each of the G sub-pixels.

3. The method according to claim 1, wherein the non-transparent areas of the optical grating are provided above black matrix areas located on two sides of each of the G sub-pixels and each of the R sub-pixels.

4. The method according to claim 1, wherein the display panel is a top-lit OLED display panel,
   wherein each of the sub-pixels including a pixel defining layer, and
   wherein the method comprises increasing a thickness of a pixel defining layer of a sub-pixel, so that when the sub-pixel is observed at a large viewing angle, light transmitted through the sub-pixel is partially blocked by the pixel defining layer.

5. The method according to claim 4, wherein only a thickness of a pixel defining layer of the G sub-pixel is increased.

6. The method according to claim 4, wherein thicknesses of pixel defining layers of the G sub-pixel and the R sub-pixel are increased.

7. A display panel, comprising a sub-pixel array formed by R, G, B sub-pixels, and black matrix areas located between the sub-pixels,
   wherein an optical grating, which is parallel with the sub-pixel array, is provided above the sub-pixel array of the display panel,
   wherein the optical grating includes transparent areas and non-transparent areas, the non-transparent areas being provided above the black matrix areas, a width of each non-transparent area being less than a width of a part of the black matrix area between every two adjacent sub-pixels; and
   wherein the optical grating is configured as such that when a sub-pixel is observed at a large viewing angle, light transmitted through the sub-pixel is partially blocked by the non-transparent areas of the optical grating;
   wherein a projection of each non-transparent area on the display panel is not located within the sub-pixels;
   wherein a distance between the projection of each non-transparent area on the display panel and a G sub-pixel being proximate to the projection of each non-transparent area is less than each of a distance between the projection of each non-transparent area and an R sub-pixel being proximate to the projection of each non-transparent area and a distance between the projection of each non-transparent area and a B sub-pixel being proximate to the projection of each non-transparent area.

8. The display panel according to claim 7, wherein the non-transparent areas of the optical grating are provided only above black matrix areas that are located on two sides of each of the G sub-pixels.

9. The display panel according to claim 7, wherein the non-transparent areas of the optical grating are provided above black matrix areas located on two sides of each of the G sub-pixels and each of the R sub-pixels.

10. The display panel according to claim 7,
    wherein the display panel is a top-lit OLED display panel, and
    wherein a thickness of a pixel defining layer of a sub-pixel of the display panel is increased so that when the sub-pixel is observed at a large viewing angle, light transmitted through the sub-pixel is partially blocked by the pixel defining layer.

11. The display panel according to claim 10, wherein only a thickness of a pixel defining layer of the G sub-pixel is increased.

12. The display panel according to claim 10, wherein thicknesses of pixel defining layers of the G sub-pixel and the R sub-pixel are increased.

\* \* \* \* \*